United States Patent [19]
Dart et al.

[11] 4,071,424
[45] Jan. 31, 1978

[54] PHOTOPOLYMERIZABLE COMPOSITION

[75] Inventors: Edward Charles Dart; Josef Nemcek, both of Runcorn, England

[73] Assignee: Imperial Chemical Industries Limited, Great Britain

[21] Appl. No.: 549,052

[22] Filed: Feb. 11, 1975

Related U.S. Application Data

[63] Continuation of Ser. No. 294,781, Oct. 4, 1972, abandoned.

[30] Foreign Application Priority Data

Oct. 18, 1971 United Kingdom ............... 48365/71
Mar. 2, 1972 United Kingdom ................. 9807/72

[51] Int. Cl.² ............... C08F 8/00; C08F 8/18; C08F 2/46
[52] U.S. Cl. .......... 204/159.15; 204/159.18; 204/159.14; 204/159.19; 204/159.23; 204/159.24; 427/44; 427/53; 427/54
[58] Field of Search ........ 204/159.15, 159.22, 204/159.23, 159.14, 159.18; 96/115 R

[56] References Cited

U.S. PATENT DOCUMENTS

| | | | |
|---|---|---|---|
| 3,625,744 | 12/1971 | Juna | 204/159.23 |
| 3,729,404 | 4/1973 | Morgan | 204/159.15 |
| 3,759,807 | 9/1973 | Osborn et al. | 204/159.23 |
| 3,832,188 | 8/1974 | Bamba et al. | 96/115 P |
| 3,839,171 | 10/1974 | Akamatsu et al. | 204/159.15 |
| 3,864,133 | 2/1975 | Hisamatsu et al. | 96/115 P |
| 3,931,075 | 1/1976 | Trecker et al. | 260/23 EP |

FOREIGN PATENT DOCUMENTS 1,304,112 1/1970 United Kingdom ............ 204/159.23

Primary Examiner—Murray Tillman
Assistant Examiner—Thurman K. Page
Attorney, Agent, or Firm—Cushman, Darby & Cushman

[57] ABSTRACT

A photopolymerizable composition comprising at least one polymerizable ethylenically unsaturated material, for example, an ethylenically unsaturated monomer, and a photosensitive catalyst comprising a. at least one photosensitizer having the structure

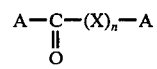

where X is >C=O, >CR₁R₂ or >CR₃OR₄, especially >C=O, R₁ to R₄ and hydrogen or hydrocarbyl groups, n is 0 or 1, and the groups A are hydrocarbyl or substituted hydrocarbyl groups, the groups A being aromatic or substituted aromatic when n is 1 and X is >CR₁R₂ and when n is 0, and b. at least one reducing agent, for example, an amine or a phosphine, capable of reducing the photosensitizer when the photosensitizer is in an excited state.

12 Claims, No Drawings

PHOTOPOLYMERIZABLE COMPOSITION

This is a continuation of application Ser. No. 294,781, filed Oct. 4, 1972, now abandoned.

This invention relates to a photopolymerisable composition comprising an ethylenically unsaturated polymerisable material and a photosensitive catalyst, and to a process for the production of polymeric materials from said composition.

It is known to polymerise an ethylenically unsaturated polymerisable material by irradiating the material with visible or ultraviolet radiation in the presence of a photosensitiser which is capable of absorbing the radiation.

It has also been proposed to polymerise an ethylenically unsaturated polymerisable material by irradiating the material in the presence of a photosensitive dye, e.g. rose bengal, and a reducing agent which is capable of reducing the photosensitive dye when the dye is in an excited state. The photosensitive dyes are in general highly coloured and photopolymerisable compositions containing such dyes are generally very sensitive to the presence of oxygen, that is, in the presence of oxygen the rate of polymerisation of the composition when irradiated with radiation of a wavelength which is absorbed by the dye is generally considerably reduced when compared with the rate of polymerisation of the composition in the absence of oxygen.

We have found novel combinations of certain photosensitisers and reducing agents which, with polymerisable ethylenically unsaturated material, form the photopolymerisable compositions of the present invention. The photosensitisers are colourless, or at most only weakly coloured, and thus are not dyes. The compositions containing the novel combinations of photosensitiser and reducing agent are in general polymerisable at a greater rate, and often at a considerably greater rate, than are compositions which contain photosensitiser but which do not contain a reducing agent. Moreover, the photosensitive catalysts in the compositions of the present invention are in general less susceptible to the presence of oxygen than are many of the photosensitive dyes and reducing agents proposed hitherto. For example, where the polymerisable ethylenically unsaturated material in the composition is a mixture of an ethylenically unsaturated polyester and an ethylenically unsaturated monomer and the photosensitive catalyst is a mixture of a dye, e.g. rose benzal, and a reducing agent then the rate of polymerisation which may be obtained on irradiation with suitable radiation is much reduced in the presence of oxygen. On the other hand, where the photosensitive catalyst is one of the novel combinations of photosensitisers and reducing agents described herein then the rate of polymerisation which is observed is in general at most only slightly reduced in the presence of oxygen.

The compositions of our invention are stable in the dark such that little if any polymerisation takes place after the composition has been standing for weeks or even months in the dark. Polymerisation of the ethylenically unsaturated material is initiated only under the influence of radiation of a suitable wavelength.

Accordingly, the present invention provides a photopolymerisable composition comprising at least one polymerisable ethylenically unsaturated material and a photosensitive catalyst comprising a. at least one photosensitiser having the structure

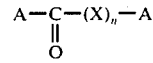

where X is $>C=O$, $>CR_1R_2$ or $>CR_3OR_4$, where $R_1$ to $R_4$ which may be the same or different, are hydrogen or hydrocarbyl groups, $n$ is 0 or 1, and the groups A, which may be the same or different, are hydrocarbyl or substituted hydrocarbyl groups, the groups A being aromatic or substituted aromatic when $n$ is 1 and X is $>CR_1R_2$ and when $n$ is 0, and b. at least one reducing agent capable of reducing the photosensitiser when the photosensitiser is in an excited state.

According to a further embodiment of the invention there is provided a process for the preparation of a polymeric material which comprises irradiating a photopolymerisable composition as herein described with radiation having a wavelength which is capable of being absorbed by the photosensitiser so as to convert the photosensitiser to an excited state.

The radiation may be visible light or ultraviolet radiation or radiation which includes within its spectrum radiation of both visible and ultraviolet wavelengths. Suitably, the radiation may have a wavelength in the range 230 mμ to 600 mμ. Sunlight may be used as the source of radiation although the wavelength of radiation to be used will be determined by the particular photosensitiser in the composition, the radiation being of a wavelength such as to be absorbed by the photosensitiser so as to convert the photosensitiser to an excited state. A suitable wavelength may be chosen by means of simple experiment e.g. by measuring the electronic absorption spectrum of the photosensitiser.

In general the groups A in the photosensitiser will be aliphatic or aromatic and it is to be understood that the groups A may be the same or different, that is, for example, in the photosensitiser of structure I both groups A may be aromatic, or both may be aliphatic, or one group A may be aromatic and the other aliphatic provided that when $n$ is 1 and X is $>CR_1R_2$, and when $n$ is 0, both groups A are aromatic. However, for reasons of convenience in the preparation of the photosensitiser the groups A are preferably the same.

Within the scope of the term aliphatic groups we include cycloaliphatic groups and aliphatic groups carrying aromatic substituents, that is, alkaryl groups. Similarly, within the scope of the term aromatic group we include groups carrying alkyl substituents, that is, aralkyl groups.

The aromatic group may be a benzenoid aromatic group, e.g. the phenyl group, or it may be a non-benzenoid cyclic group which is recognised in the art as possessing the characteristics of a benzenoid aromatic group.

The groups A, especially when aromatic, may carry substituent groups other than hydrocarbyl, e.g. halogen or alkoxy, provided the photosensitiser containing the substituents groups is not present in the photopolymerisable composition in such a concentration as to result in substantial inhibition of polymerisation of the ethylenically unsaturated material in the composition.

In the photosensitiser having the structure I the group X preferably has the structure $>C=O$ or $>CR_3OR_4$ where $R_3$ and $R_4$ are as hereinbefore described.

The groups $R_1$, $R_2$, $R_3$ and $R_4$ may be hydrogen or hydrocarbyl groups, for example alkyl. Preferably the groups $R_1$ to $R_4$ are hydrogen.

In the photosensitiser having the structure I the groups A may be further linked together by a direct link, or by a divalent group, e.g. a divalent hydrocarbyl group, that is, in addition to the link through the group

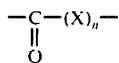

the groups A may be further linked so as to form a cyclic ring system. For example, where the groups A are aromatic the photosensitiser may have the structure

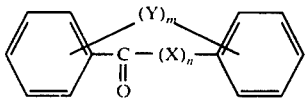

in which X and n are as hereinbefore described, Y is $>CH_2$, or hydrocarbyl derivative thereof, and $m$ is 0, 1 or 2. Preferably, the group Y is linked to the aromatic groups in positions ortho to the group

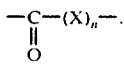

The groups A together may form a fused aromatic ring system.

Particularly preferred photosensitisers on account of the rapid rates at which the ethylenically unsaturated material may be polymerised are α-diketones having the structure I in which X is $>C=0$ and $n$ is 1. In general, the α-diketones are capable of being excited by radiation in the visible region of the spectrum, that is, by light having a wavelength greater than 400 mμ, e.g. in the wavelength range 400 mμ to 500 mμ, although ultraviolet radiation, or a mixture of ultraviolet radiation and visible light, may be used. Suitable α-diketone photosensitisers include biacetyl in which both groups A are methyl, benzil in which both groups A are phenyl, α-diketones in which both of the groups A are fused aromatic, e.g. α-naphthil and β-naphthil, and α-diketones in which the groups A are aralkyl groups, e.g. p-tolil. As an example of a suitable α-diketone photosensitiser in which the groups A are non-benzenoid aromatic there may be mentioned furil in which the groups A have the structure

e.g. 2:2'-furil. In the α-diketone photosensitiser the groups A may carry non-hydrocarbyl groups, for example, the photosensitiser may be p,p'-dialkoxy benzil, e.g. p,p'-dimethoxy benzil, or p,p'-dihalobenzil, e.g. p,p'-dichlorobenzil, or p-nitrobenzil.

In the photosensitiser having the structure I, $n$ may be zero in which case the groups A are aromatic or substituted aromatic. An example of such a photosensitiser is benzophenone in which both the groups A are phenyl.

Further suitable photosensitisers include those having the structure I in which $n$ is 1 and X is $>CR_3OR_4$. For example, the photosensitiser may be benzoin in which $R_3$ and $R_4$ are H and both the groups A are phenyl, an alkyl benzoin in which $R_3$ is hydrogen and $R_4$ is alkyl, e.g. methyl, α-naphthoin and β-naphthoin in which both the groups A are fused aromatic, p,p'-dialkoxy benzoin, e.g. p,p'-dimethoxy benzoin, and p,p'-dihalobenzoin. e.g. p,p'-dichloro benzoin, in which the groups A carry non-hydrocarbyl groups, and furoin in which the groups A are non-benzenoid aromatic and have the structure

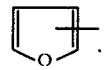

e.g. 2,2'-furoin.

In the photosensitiser the groups A may be linked together by a direct link or by a divalent hydrocarbyl group to form a cyclic ring system. For example, where the groups A are aliphatic the photosensitiser may be camphorquinone.

Where the photosensitiser has the structure II suitable photosensitisers include fluorenone in which $n$ and $m$ are both zero and the aromatic groups A are linked by a direct link ortho to the group

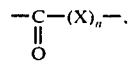

and phenanthraquinone in which X is $>C=0$, $n$ is 1, and $m$ is 0, the aromatic groups A being linked by a direct link ortho to the group

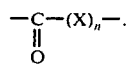

The photosensitiser may be acenaphthene quinone in which the groups A in structure I together form a fused aromatic ring system.

The photosensitiser may, for example, be present in the photopolymerisable composition in a concentration in the range 0.001% to 10% by weight of the ethylenically unsaturated material in the composition although concentrations outside this range may be used if desired. Suitably the photosensitiser is present in a concentration of 0.1% to 7%, and more preferably 0.5% to 5%, by weight of the ethylenically unsaturated material in composition.

The reducing agent present in the photopolymerisable composition should have a reduction potential such that it is capable of reducing the photosensitiser when the photosensitiser is in an excited state yet is incapable of reducing the photosensitiser when the latter is not excited by radiation. Furthermore, it is believed the reducing agent, when oxidised by the excited photosensitiser, should be capable of initiating polymerisation of the ethylenically unsaturated material. The reducing agent, at the concentration at which it is present in the photopolymerisable composition, should have little or no inhibiting effect on polymerisation. Whether or not a reducing agent has an inhibiting effect may be determined by means of simple experiment, for example, by effecting polymerisation of the ethylenically unsaturated material by means of a thermal initiator in the presence of, and in the absence of, a reducing agent in the desired concentration and comparing the rates of polymerisation in the presence and absence of the reducing agent.

Suitable reducing agents include compounds having the structure

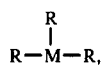

where M is an element of Group Vb of the Periodic Table of the Elements and the units R, which may be the same or different, are hydrogen atoms, hydrocarbyl groups, substituted hydrocarbyl groups or groups in which two units R together with the element M form a cyclic ring system, no more than two of the units R being hydrogen atoms, and wherein the element M is attached directly to an aromatic group R, at least one of the groups R has a

group attached to M.

The Periodic Table of the Elements referred to is that published in "Advanced Inorganic Chemistry", second edition, by F A Cotton and G Wilkinson (Interscience 1966).

Preferably, the reducing agent having the structure

is free of aromatic groups attached directly to the element M.

The element M in the reducing agent may be, for example, phosphorous or more preferably nitrogen. If desired, M may be arsenic or antimony.

The reducing agent may be primary, secondary or tertiary, that is, in the structure

two, one or none of the units R respectively may be hydrogen atoms. For example, the reducing agent may be a primary, secondary or tertiary amine or phosphine.

One or more of the groups R may be hydrocarbyl. The hydrocarbyl group may be, for example, alkyl, cycloalkyl or alkaryl. Suitably, the group R may be an alkyl group having from 1 to 10 carbon atoms.

Examples of suitable reducing agents in which one or more of the units R is hydrocarbyl include propylamine, n-butylamine, pentylamine, hexylamine, dimethylamine, diethylamine, dipropylamine, di-n-butylamine, dipentylamine, trimethylamine, triethylamine, tripropylamine, tri-n-butylamine, tripentylamine, dimethylaminoethyl methacrylate, and long chain fatty amines, e.g. $C_{18}H_{37}NMe_2$. Examples of reducing agents containing aromatic groups include N,N'-dimethyl aniline and N-methyl diphenylamine.

It is to be understood that throughout this specification where we refer to specific examples of suitable reducing agents in which the element M is nitrogen we also wish to include corresponding specific examples in which the element M is phosphorous, arsenic or antimony.

One or more of the units R may be a substituted hydrocarbyl group and in particular the hydrocarbyl group may carry a substituent having the structure

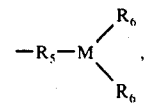

where M is an element of Group Vb of the Periodic Table of the Elements and the unit $R_5$ is, for example, an alkylene chain and the units $R_6$, which may be the same or different, are for example, hydrogen atoms or hydrocarbyl groups.

Examples of reducing agents having the structure

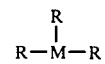

in which at least one of the units R is a substituted hydrocarbyl group include diamines of the structure

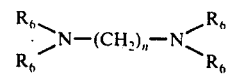

in which n is a whole number of at least two and the groups $R_6$, which may be the same or different, are hydrogen atoms or hydrocarbyl, especially alkyl, groups. For example, the reducing agent may be ethylene diamine, trimethylene diamine, tetramethylene diamine, pentamethylene diamine or hexamethylene diamine, of N-hydrocarbyl, especially N-alkyl derivatives thereof. Other suitable reducing agents include derivatives having the structure

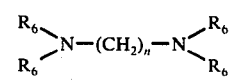

in which one or more of the hydrogen atoms in the $-CH_2$ unit carry an

group, especially an $-NH_2$ group.

Examples of reducing agents in which the element M forms part of a cyclic ring system include piperidine, and N-hydrocarbyl, especially N-alkyl, derivatives of piperidine.

Other reducing agents include triallylamine,

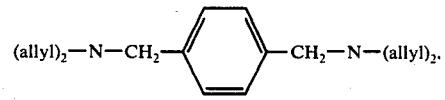

allyl thiourea, o-tolyl thiourea, soluble salts of aromatic sulphinic acids, e.g. S-benzyl iso-thiuronium p-toluene sulphinate, and sodium diethyl dithiophosphate.

Suitably the concentration of the reducing agent may be in the ranges hereinbefore described in respect of the photosensitiser although concentrations outside these ranges may be used if desired. Preferably, the reducing agent is present in a concentration of 1% to 5% by weight of the ethylenically unsaturated material in the photopolymerisable composition.

Where one or more of the groups R in the reducing agent

is aromatic then it is preferred to have a concentration of reducing agent in the photopolymerisable composition in the range 0.01% to 0.5% by weight of the ethylenically unsaturated material in the composition on account of the more rapid rates of polymerisation which may be obtained when the reducing agent is present in this concentration range.

The photosensitiser and the reducing agent desirably should be soluble in the ethylenically unsaturated material at least to an extent sufficient to give the desired concentration therein. Although polymerisation will proceed if the photosensitiser and reducing agent are not completely soluble it is much preferred that the photosensitiser and the reducing agent are together completely soluble in the ethylenically unsaturated material to the desired extent.

The method of mixing of the photosensitiser and reducing agent with the ethylenically unsaturated material may have a bearing on the success or otherwise of achieving the desired concentrations of photosensitiser and reducing agent therein.

Thus, where the photosensitiser or reducing agent is not sufficiently soluble in the ethylenically unsaturated material, or where one or the other may be dissolved only with difficulty, we have found that dissolution of the photosensitiser and/or reducing agent may be assisted by addition to the ethylenically unsaturated material of a small amount of a diluent in which the photosensitiser or reducing agent is soluble and which is miscible with the ethylenically unsaturated material. Suitably, the photosensitiser or reducing agent may be introduced into the ethylenically unsaturated material in the form of a solution in such a diluent.

The photosensitiser and reducing agent may be dissolved in the same batch of a suitable diluent and then added to the ethylenically unsaturated material. Alternatively, the photosensitiser and reducing agent may be dissolved in different batches of the same or different diluents and added to the ethylenically unsaturated material. The method of addition, the diluent or diluents, and the amounts thereof to be used will readily be determined by a skilled man.

In general, polymerisation of the ethylenically unsaturated material proceeds readily at ambient temperature when the composition is irradiated with radiation having a wavelength which converts the photosensitiser to an excited state. However, the rate of polymerisation may in general be increased by effecting the polymerisation at a temperature above ambient.

The polymerisable ethylenically unsaturated material, which should be free-radically polymerisable, is suitably at least one monomer containing ethylenic unsaturation in a terminal group. For example, the ethylenically unsaturated material may be one or more monomers selected from vinyl monomers, allyl monomers and vinylidene monomers.

Suitable vinyl monomers which may be polymerised include, for example, vinyl esters, aromatic vinyl compounds and vinyl nitriles.

Vinyl esters suitable for use in the method of our invention include, for example, vinyl acetate and esters of acrylic acid having the structure $CH_2 = CH - COOR_7$, where $R_7$ is an alkyl, aryl, alkaryl, aralkyl or cycloalkyl group. For example, $R_7$ may be an alkyl group having from 1 to 20, and preferably 1 to 10 carbon atoms. Particular vinyl esters which may be mentioned include, for example, methyl acrylate, ethyl acrylate, n- and isopropylacrylates, and n-, iso- and tertiary butyl acrylates.

Other suitable vinyl esters include, for example, esters of the formula $CH_2 = C(R_8)COOR_7$, where $R_8$ is methyl. In the ester of formula $CH_2 = C(R_8)COOR_7$, $R_7$ and $R_8$ may be the same or different. Particular vinyl esters which may be mentioned include, for example, methyl methacrylate, ethyl methacrylate, n- and isopropylmethacrylate, and n-, iso- and tertiary butyl methacrylate. Suitable aromatic vinyl compounds include, for example styrene and derivatives thereof, e.g. α-alkyl derivatives of styrene, e.g. α-methyl styrene, and vinyl toluene.

Suitable vinyl nitriles include, for example, acrylonitrile and derivatives thereof, e.g. methacrylonitrile.

Other suitable vinyl monomers include vinyl pyrollidone, and hydroxyalkyl acrylates and methacrylates, e.g. hydroxyethyl acrylate, hydroxypropylacrylate, hydroxyethyl methacrylate and hydroxypropylmethacrylate.

The ethylenically unsaturated material may include at least one ethylenically unsaturated polymer, suitably in combination with at least one ethylenically unsaturated monomer. For example, the ethylenically unsaturated polymer may be an ethylenically unsaturated polyester formed by condensation of at least one ethylenically unsaturated polycarboxylic acid or anhydride, optionally in combination with at least one saturated polycarboxylic acid or anhydride, with at least one polyol.

Where the photopolymerisable commposition includes a mixture of an ethylenically unsaturated polyester and an ethylenically unsaturated monomer the polyester and monomer may suitably be present in the composition in a proportion by weight of polyester : monomer of 99:1 to 1:99, preferably 90:10 to 10:90.

We have found that where the ethylenically unsaturated material in the photopolymerisable composition comprises a mixture of an ethylenically unsaturated polyester and an ethylenically unsaturated monomer then, particularly where the reducing agent is an amine, the acceleration in the rate of polymerisation of the ethylenically unsaturated material which is obtained by including a given concentration of reducing agent in the composition is greater the lower is the acid value of the ethylenically unsaturated polyester in the composition.

The ethylenically unsaturated monomer may be, or may include, a polyfunctional monomer polymerisation of which will lead to the production of cross-linked materials. Suitable polyfunctional ethylenically unsaturated monomers include, for example, divinyl benzene, glycol dimethacrylate and a reaction product of a hydroxyalkyl acrylate or methacrylate with an isocyanate-ended adduct of a diol and a diisocyanate, for example, a reaction product of hydroxy ethyl methacrylate and an isocyanate-ended adduct of 4:4'-diphenyl methane diisocyanate and oxypropylated bisphenol-A.

Where the ethylenically unsaturated material is a solid then it may be convenient, in order to produce a liquid composition, to include in the composition sufficient amount of a suitable diluent. The diluent should, of course, have little or no inhibiting effect on the polymerisation of the ethylenically unsaturated material in the composition.

The compositions of our invention are suitable for the production of shaped articles of polymeric materials, for example sheets, and are particularly suitable for use in the preparation of polymeric materials in the form of films and in particular paint films. Thus, as the compositions of our invention are substantially stable such that little or no polymerisation of the ethylenically unsaturated material takes place in the absence of radiation they form can-stable compositions which may be formed into a film, e.g. a paint film, and then caused or allowed to polymerise by exposure to light, e.g. by exposing the film to natural light, e.g. sunlight. When formed into a film and exposed to light the compositions rapidly polymerise.

The compositions used in the process of our invention, especially compositions which are to be used in the production of cross-linked materials, especially paint films, may contain pigments, which may be organic or inorganic.

Where the composition contains a pigment a photosensitiser should be chosen which is excited by radiation having a wavelength which is not absorbed to an excessive extent by the pigment present in the composition. Preferably, the pigment should be transparent to radiation at the wavelength which excites the photosensitiser. Where the pigment absorbs ultraviolet radiation but absorbs little or no radiation in the visible region of the spectrum those photosensitisers in the compositions of our invention which are excited by visible light, for example, the α-diketones, are especially useful.

Other additives may be present in the photopolymerisable compositions, e.g. antioxidants and u.v. stabilisers.

The invention is now illustrated by the following examples in which all parts are expressed as parts by weight.

EXAMPLE 1

2 Parts of benzil were dissolved in 263 parts of a mixture of 38% by weight of styrene and 62% by weight of an unsaturated polyester, the polyester having an acid value of 41 mg KOH g$^{-1}$ and being made by condensing propylene glycol, fumaric acid and isophthalic acid (fumaric acid: isophthalic acid molar ratio 3:1). The resultant mixture was charged to a pyrex glass bottle which was then stoppered and irradiated by a mixture of ultraviolet and visible radiation from eight 20 watt blue fluorescent tubes (Atlas). The maximum emission was at 425 mμ. The tubes were circularly disposed and the bottle was placed about 3 inches from each tube.

After irradiating for 20 minutes the contents had gelled to such an extent that they could no longer be poured. This will be referred to hereinafter as the gel point.

In further experiments pyrex glass bottles were charged with benzil and the mixture of styrene and unsaturated polyester following the above procedure and in addition with 4 parts by weight of reducing agent. The gel times obtained in the presence of a number of different reducing agents are summarised in the Table I.

TABLE 1

| Reducing Agent | Gel Time |
| --- | --- |
| Dimethylaminoethyl methacrylate | 15 seconds |
| n-butylamine | 6 minutes |
| di-n-butylamine | 3 minutes |
| triethylamine | 35 seconds |

TABLE 1-continued

| Reducing Agent | Gel Time |
| --- | --- |
| tri-n-butylphosphine | 2½ minutes |
| allylthiourea | 2.1 minutes |
| S-benzyl iso-thiuronium p-toluene sulphinate | 1 minute |

EXAMPLE 2

The procedure of Example 1 was repeated except that in a first experiment conducted in the absence of reducing agent, 4 parts of fluorenone were used in place of benzil, and in a second experiment, conducted in the presence of reducing agent, 4 parts of dimethylaminoethyl methacrylate were used as reducing agent. The gel times observed were respectively approximately 2 hours and 6 minutes.

EXAMPLE 3

The procedure of Example 1 was repeated except that in a first experiment, conducted in the absence of reducing agent, 0.1 part of phenanthraquinone was used in place of benzil, and in a second experiment, conducted in the presence of reducing agent, 4 parts of dimethylaminoethyl methacrylate were used as reducing agent. The gel times observed were respectively approximately 30 minutes and 3 minutes.

EXAMPLE 4

The procedure of Example 3 was repeated except that 2 parts of benzophenone were used in place of the phenanthraquinone and the light source used was a 250 watt medium pressure mercury lamp (Hanovia), the pyrex glass bottle being placed 10 cm from the lamp.

The gel times observed were respectively approximately 2 hours and 33 minutes.

EXAMPLE 5

The procedure of Example 1 was repeated except that the pyrex glass bottle was charged with 100 parts of a compound having the structure XHNCONHX, where X has the structure -CH$_2$-O-CH$_2$CH$_2$-OCOC(CH$_3$)=CH$_2$, and 2 parts of benzil. The gel time observed on irradiating tge contents of the bottle was 25 minutes.

In two further experiments the above procedure was repeated except that the bottles were also charged with 4 parts dimethylaminoethyl methacrylate and 4 parts of allylthiourea respectively. The respective gel times observed were 2 minutes 45 seconds and 1 minute 25 seconds.

EXAMPLE 6

To a solution of 2 parts of benzil and 4 parts of dimethylaminoethyl methacrylate in 263 parts of a mixture of styrene and unsaturated polyester as used in Example 1 there was added 3 parts of a 10% by weight solution of paraffin wax in toluene. The mixture was cast onto a metal plate and exposed to the light from two 2 Kwatt high pressure mercury lamps. The plate was placed at a distance of 10 cm from the lamps. After exposure to the light for 15 seconds a hard cross-linked film was produced.

A similar result was obtained when the mixture contained 30 parts of dispersed rutile titanium dioxide.

EXAMPLE 7

2 Parts of α-naphthil and 4 parts of dimethylamino ethyl methacrylate were dissolved in 260 parts of a mixture of 38% by weight of styrene and 62% by weight of an unsaturated polyester as used in Example 1. The resultant mixture was charged to a pyrex glass bottle which was then stoppered and irradiated by light from eight 20 watt blue fluorescent tubes (Atlas). The tubes were circularly disposed and the bottle was placed about 3 inches from each tube.

After irradiating for 2.5 minutes the contents of the tube had gelled to the extent that they could no longer be poured.

By way of comparison the above procedure was repeated except that the dimethyl amino ethyl methacrylate was omitted. In this case the contents of the bottle had not gelled even after irradiating for 30 minutes.

EXAMPLE 8

The procedure of Example 7 was repeated except that the α-naphthil was replaced by β-naphthil.

In the presence of dimethylamino ethyl methacrylate the contents of the bottle gelled after irradiating for 2 minutes, whereas, by way of comparison, in the absence of dimethyl amino ethyl methacrylate the contents of the bottle gelled after irradiating for 6 minutes.

EXAMPLE 9

The procedure of Example 7 was repeated except that the α-naphthil was replaced by p-tolil.

In the presence of dimethyl amino ethyl methacrylate the contents of the bottle gelled after irradiating for 15 seconds whereas, by way of comparison, in the absence of dimethylamino ethyl methacrylate the contents of the bottle had not gelled after irradiating for 30 minutes.

EXAMPLE 10

In a number of experiments 100 parts by weight of a mixture of 38% by weight of styrene and 62% by weight of an unsaturated polyester as used in Example 1 was polymerised following the procedure of Example 1 using a number of different photosensitisers and, for the sake of comparison, the photosensitisers were used alone and in the presence of a reducing agent. The results are summarised in Table 2.

EXAMPLE 11

The procedure of Example 1 was followed using, in place of the mixture of styrene and unsaturated polyester used in Example 1, the monomers and mixtures of monomers in the amounts given in Table 3, and in place of the benzil and reducing agents in the amounts used in Example 1, the photosensitisers and reducing agents in the amounts given in Table 3.

The irradiation procedure and the gel time measurement procedure used was as described in Example 1.

TABLE 2

| Photosensitiser parts by weight | | Reducing Agent Dimethylaminoethylmethacrylate parts by weight | Gel Time |
|---|---|---|---|
| Acenaphthenequinone | 0.2 | 4 | 3 minutes |
| " | " | 0 | >15 minutes |
| β-naphthoin | 2.0 | 4 | 6 minutes |
| " | " | 0 | 15 minutes |
| α-naphthoin | 2.0 | 4 | 2 minutes |
| " | " | 0 | 7 minutes |
| Benzoin | 2.0 | 4 | 4 minutes |
| " | " | 0 | 8 minutes |
| 4:4'-dichlorobenzil | 0.35 | 4 | 1 minute |
| " | " | 0 | 30 minutes |
| Anisil | 2.0 | 4 | ½ minute |
| " | " | 0 | >10 minutes |
| Anisoin | 2.0 | 4 | 4 minutes |
| " | " | 0 | >10 minutes |
| Furil | 0.3 | 4 | 4 minutes |
| " | " | 0 | >20 minutes |
| Biacetyl | 2.0 | 4 | 2 minutes |
| " | " | 0 | >10 minutes |
| Camphorquinone | 2.0 | 4 | ½ minute |
| " | " | 0 | >20 minutes |

TABLE 3

| Experiment | Monomer parts by weight | Photosensitiser parts by weight | Reducing Agent parts by weight | Gel Time |
|---|---|---|---|---|
| A 1 | N-vinyl pyrollidone 95 glycol dimethacrylate 5 | Benzil 2 | Allyl thiourea 4 | 5 minutes |
| A 2 | " | " | — | 15 minutes |
| B 1 | Styrene 95 Divinylbenzene 5 | Benzil 2 | Dimethoamino ethyl methacrylate 4 | 300 minutes |
| B 2 | " | " | — | >400 minutes |
| C 1 | Methyl methacrylate 95 glycol dimethacrylate 5 | Benzil 2 | Dimethylamino ethyl methacrylate 4 | 45 minutes |
| C 2 | " | " | — | 120 minutes |
| D 1 | *Vinyl urethane 66.7 methyl methacrylate 33.3 | Benzil 2 | Dimethylamino ethyl methacrylate 4 | 1¼ minutes |
| D 2 | " | " | — | 4¼ minutes |
| E 1 | Acrylonitrile 95 glycol dimethacrylate 5 | Benzil 2 | Dimethylamino ethyl methacrylate 4 | 30 minutes |
| E 2 | " | " | — | >90 minutes |
| F 1 | Hydroxy ethyl methacrylate 100 | Biacetyl 2 | Dimethylamino ethyl methacrylate 4 | 4½ minutes |
| F 2 | " | " | — | 7 minutes |
| F 3 | " | Benzil 2 | Dimethylamino ethyl methacrylate 4 | 7 minutes |
| F 4 | " | " | — | >20 minutes |

*A vinyl-ended reaction product of hydroxyethyl methacrylate and an isocyanate ended adduct of 2 molecules of 4:4'-diphenylmethane diisocyanate and 1 molecule of oxypropylated bisphenol A of molecular weight approximately 1040.

EXAMPLE 12

In order to demonstrate the stability of the photopolymerisable compositions in the absence of radiation two solutions were made up each containing 100 parts by weight of a mixture of styrene and unsaturated polyester as used in Example 1, 4 parts by weight of dimethylamino ethyl methacrylate and, respectively, 2 parts by weight of benzil and 2 parts by weight of fluorenone.

The solutions were stored separately in darkened, stoppered bottles.

After storage for 15 months the bottles were opened. The mixtures of styrene and unsaturated polyester showed little if any change in viscosity indicating little if any polymerisation had taken place during storage.

EXAMPLE 13

Experiment A

Following the procedure of Example 1 4 pyrex glass bottles were separately charged with a solution of 100 parts by weight of a mixture of styrene and unsaturated polyester as used in Example 1, 4 parts by weight of dimethylaminoethyl methacrylate and, respectively, 2, 0.5, 0.1 and 0.05 parts of benzil.

The bottles were irradiated with a mixture of visible and ultraviolet radiation (maximum emission 425 m$\mu$) from eight 20 watt blue fluorescent tubes (Atlas) following the procedure described in Example 1.

The gel times of the mixtures in the bottles were respectively 20 seconds, 25 seconds, 60 seconds and 95 seconds.

Experiment B

The above procedure was repeated except that the blue fluorescent tubes were replaced by eight 20 watt blacklight blue tubes (Atlas). The blacklight blue tubes emit ultraviolet radiation with a maximum emission at 350 m$\mu$.

The gel times of the mixtures in the bottles were respectively 10 minutes, 60 seconds, 70 seconds and 90 seconds.

Experiment C

The procedure of experiment A above was repeated except that the radiation incident on the pyrex glass bottles was first filtered through a 1 cm path length of an 8% aqueous solution of sodium nitrite in order to filter out the ultraviolet radiation from the radiation emitted by the blue fluorescent tubes.

The gel times were unchanged.

EXAMPLE 14

In two separate experiments the procedure of Example 1 was followed using 100 parts of a mixture of styrene and an unsaturated polymer, 2 parts of benzil and as reducing agent, 1 part of o-tolyl thiourea and 2 parts of sodium diethyl dithiophosphate.

The gel times were respectively 2 minutes and 5 minutes.

EXAMPLE 15

The procedure of Example 1 was followed using 100 parts of a mixture having an acid value of 25 mg KOH g$^{-1}$ and comprising 30 parts of styrene and 70 parts of an unsaturated polyester made by condensing propylene glycol, maleic anhydride and isophthalic acid (maleic anhydride:isophthalic acid molar ratio 2:1). After irradiation for 18 minutes the contents of the bottle had reached the gel point.

In a further experiment the procedure described above was repeated except that the mixture of unsaturated polyester and styrene had an acid value of 0.8 mg KOH g$^{-1}$. The unsaturated polyester was made in the manner described above except that the condensation reaction was carried out until the unsaturated polyester had an acid value of 10 mg KOH g$^{-1}$ and the polyester was subsequently reacted with a glycidyl ester (Cardura E, Shell Chemical Company, Cardura is a Registered Trade Mark) until a polyester having the desired acid value was produced.

The gel point was reached after irradiation for 15 seconds.

EXAMPLE 16

A paint composition was made by blending together 25 parts of titanium dioxide, 63 parts of a mixture of styrene and an unsaturated polyester as described in Example 15, the mixture having an acid value of 0.8 mg KOH g$^{-1}$, 3 parts of silica, 0.3 part of paraffin wax, 0.35 part of benzil and 0.35 part of dimethylaminoethyl methacrylate.

A 0.003 inch wet film was spread on a plate and placed 20 cm from two 2 Kwatt high pressure mercury lamps. The film cured in two minutes to a hard non-tacky film.

A similar film was cured by exposure to daylight.

In a further experiment the above procedure was followed except that in addition 2.5 parts of a blue pigment (Monolite Fast Blue 3RS, Imperial Chemical Industries Limited, Monolite is a Registered Trade Mark) were blended with the paint composition.

The paint film required 2½ minutes irradiation by the two 2 Kwatt high pressure mercury lamps to cure to a hard non-tacky film.

EXAMPLE 17

The procedure of Example 1 was followed in two separate experiments using 100 parts of a mixture of styrene and unsaturated polyester, 4 parts of dimethylaminoethyl methacrylate as reducing agent, and respectively 0.2 and 0.02 part of p-nitrobenzil.

The gel times were respectively 5 minutes and 2½ minutes.

EXAMPLE 18

The procedure of Example 1 was followed in two separate experiments using 100 parts of a mixture of styrene and unsaturated polyester, 2 parts of benzil, and 0.1 part of respectively, N,N-dimethyl aniline and N-methyl diphenylamine.

The gel times were respectively 80 seconds and 90 seconds.

In the absence of the reducing agent the gel time was 20 minutes.

EXAMPLE 19

To a solution of 2 parts of benzil and 4 parts of dimethylaminoethyl methacrylate in 100 parts of a mixture of styrene and an unsaturated polyester as used in Example 1 there was added 3 parts of a 10% by weight solution of paraffin wax in toluene.

A thin film of the solution was spread onto a plate and exposed in air to daylight. The film cured to a hard film in 2 to 30 minutes depending on the intensity of the daylight.

By way of comparison and in order to illustrate the sensitivity to air of photosensitive dyes proposed hitherto the above procedure was repeated except that the benzil was replaced by 0.1 part of rose bengal. The film had not cured after exposure in air to daylight for 2 days. However, when the solution containing the rose bengal was charged in bulk to a pyrex glass bottle, stoppered, and then exposed to daylight the solution gelled after 30 minutes, thus indicating that in bulk the rose bengal was capable of polymerising the mixture of styrene and unsaturated polyester.

What we claim is:

1. A photopolymerisable composition comprising at least one polymerisable ethylenically unsaturated material and a photosensitive catalyst comprising
   a. at least one photosensitizer having the structure

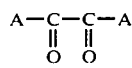

wherein the groups A, which may be the same or different, are hydrocarbyl or substituted hydrocarbyl groups, and wherein the groups A may be further linked together by a direct link or by a divalent hydrocarbyl group or wherein the groups A together form a fused aromatic ring, and
   b. at least one reducing agent capable of reducing the photosensitiser when the photosensitiser is in an excited state, the reducing agent having the structure

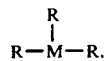

where M is an element of Group Vb of the Periodic Table of the Elements and the units R, which may be the same or different, are hydrogen atoms, hydrocarbyl groups, substituted hydrocarbyl groups, or groups in which two units R together with the element M form a cyclic ring system, no more than one of said groups R being substituted hydrocarbyl groups, no more than two of the units R being hydrogen atoms and the element M not being attached directly to an aromatic group R.

2. A photopolymerisable composition as claimed in claim 1 in which in the photosensitiser the groups A are aliphatic or aromatic.

3. A photopolymerisable composition as claimed in claim 1 in which in the photosensitiser the groups A are further linked together by a direct link or by a divalent hydrocarbyl group, or in which the groups A together form a fused aromatic ring.

4. A photopolymerisable composition as claimed in claim 1 in which the photosensitiser is at least one of benzil, biacetyl, α-naphthil, β-naphthil, furil, p,p'-dimethoxybenzil, p,p'-dichlorobenzil, p-tolil and p-nitrobenzil.

5. A photopolymerisable composition as claimed in claim 1 in which the photosensitiser is at least one of phenanthraquinone, acenaphthene quinone and camphorquinone.

6. A photopolymerisable composition as claimed in claim 1 in which the photosensitiser is present in a concentration in the range 0.001% to 10% by weight of the ethylenically unsaturated material in the composition.

7. A photopolymerisable composition as claimed in claim 1 in which the reducing agent is present in a concentration in the range 1% to 5% by weight of the ethylenically unsaturated material in the composition.

8. A photopolymerisable composition as claimed in claim 1 in which the ethylenically unsaturated material comprises at least one monomer containing ethylenic unsaturation in a terminal group.

9. A photopolymerisable composition as claimed in claim 8 in which the composition includes at least one ethylenically unsaturated polyester.

10. A photopolymerisable composition as claimed in claim 8 in which the ethylenically unsaturated monomer is at least one of methyl methacrylate, styrene, vinyl pyrollidone, acrylonitrile, vinyl acetate, hydroxyethyl methacrylate and a reaction product of hydroxyethyl methacrylate and an isocyanate-ended adduct of 4:4'-diphenylmethane diisocyanate and oxypropylated bisphenol-A.

11. A photopolymerisable composition as claimed in claim 1 which includes at least one pigment and is suitable for use as a paint composition.

12. A process for the preparation of a polymeric material which comprises irradiating a photopolymerisable composition as claimed in claim 1 with radiation having a wavelength which is capable of exciting the photosensitiser to an excited state.

* * * * *

REEXAMINATION CERTIFICATE (2625th)

United States Patent [19]
Dart et al.

[11] B1 4,071,424

[45] Certificate Issued Jul. 18, 1995

[54] PHOTOPOLYMERIZABLE COMPOSITION

[75] Inventors: Edward C. Dart; Josef Nemcek, both of Runcorn, England

[73] Assignee: Imperial Chemical Industries Limited, Millbank, England

Reexamination Request:
No. 90/002,335, May 1, 1991

Reexamination Certificate for:
Patent No.: 4,071,424
Issued: Jan. 31, 1978
Appl. No.: 549,052
Filed: Feb. 11, 1975

Related U.S. Application Data

[63] Continuation of Ser. No. 294,781, Oct. 4, 1972, abandoned.

[30] Foreign Application Priority Data

Oct. 18, 1971 [GB] United Kingdom ............ 48365/71
Mar. 2, 1972 [GB] United Kingdom ............ 9807/72

[51] Int. Cl.$^6$ .................... C08F 8/00; C08F 8/18; C08F 2/46
[52] U.S. Cl. ............................ 522/14; 522/18; 522/37; 522/107; 522/908; 430/281; 430/923; 525/20; 525/21; 525/920; 525/921
[58] Field of Search .................... 522/14, 18, 28

[56] References Cited

U.S. PATENT DOCUMENTS

| | | |
|---|---|---|
| 2,367,660 | 1/1945 | Agre . |
| 2,413,973 | 1/1947 | Howk . |
| 2,760,863 | 8/1956 | Plambeck, Jr. . |
| 2,893,868 | 7/1959 | Barney . |
| 2,902,365 | 9/1959 | Martin . |
| 2,951,758 | 9/1960 | Notley ............... 430/285 |
| 3,036,915 | 5/1962 | Notley . |
| 3,376,139 | 4/1968 | Giangualano . |
| 3,531,282 | 9/1970 | Miller . |
| 3,547,633 | 12/1970 | Rust . |
| 3,556,794 | 1/1971 | Margerum . |
| 3,625,744 | 12/1971 | Juna . |

(List continued on next page.)

FOREIGN PATENT DOCUMENTS

1090142 12/1967 United Kingdom .
1141544 2/1969 United Kingdom .
1304112 1/1973 United Kingdom .

OTHER PUBLICATIONS

Article entitled "Photopolymerizable Reproduction Systems-Chemistry and Applications" by P. Walker, V. J. Webers and G. A. Thommes pp. 150–158 of the Journal of Photographic Science.

Pamphlet entitled "The Photochemistry of $\alpha$-Dicarbonyl Compounds" by Bruce M. Monroe, pp. 77–108.

Article entitled "Image-Forming Systems Based On Photopolymerization" by D. W. Woodward; V. C. Chambers; and A. B. Cohen, pp. 360–368 of the SWING and SHIN PS & E vol. 7, 1963.

Calvert et al. "Photochemistry" John Wiley & Sons, Inc. 1966 pp. 377–379 and 569.

*Primary Examiner*—Mark A. Chapman

[57] ABSTRACT

A photopolymerizable composition comprising at least one polymerizable ethylenically unsaturated material, for example, an ethylenically unsaturated monomer, and a photosensitive catalyst comprising a. at least one photosensitizer having the structure

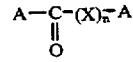

where X is $>C=O$, $>CR_1R_2$ or $>CR_3OR_4$, especially $>C=O$, $R_1$ to $R_4$ and hydrogen or hydrocarbyl groups, n is 0 or 1, and the groups A are hydrocarbyl or substituted hydrocarbyl groups, the groups A being aromatic or substituted aromatic when n is 1 and X is $>CR_1R_2$ and when n is 0, and b. at least one reducing agent, for example, an amine or a phosphine, capable of reducing the photosensitizer when the photosensitizer is in an excited state.

U.S. PATENT DOCUMENTS

| | | | |
|---|---|---|---|
| 3,673,140 | 6/1972 | Ackerman | 522/14 |
| 3,682,808 | 8/1972 | Krauch . | |
| 3,729,404 | 4/1973 | Morgan . | |
| 3,756,827 | 9/1973 | Chang | 522/28 |
| 3,759,807 | 9/1973 | Osborn . | |
| 3,832,188 | 8/1974 | Bamba . | |
| 3,839,171 | 10/1974 | Akamatsu . | |
| 3,864,133 | 2/1975 | Hisamatsu . | |
| 3,870,620 | 3/1975 | Onishi et al. . | |
| 3,878,077 | 4/1975 | Borden . | |
| 3,891,523 | 6/1975 | Hisamatsu . | |
| 3,931,071 | 1/1976 | Trecker . | |
| 3,931,075 | 1/1976 | Trecker . | |
| 3,953,309 | 4/1976 | Gilano et al. . | |
| 3,979,270 | 9/1976 | Trecker . | |

REEXAMINATION CERTIFICATE ISSUED UNDER 35 U.S.C. 307

The PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-12 are cancelled.

* * * * *